United States Patent
Lahiri et al.

(10) Patent No.: US 10,185,338 B1
(45) Date of Patent: Jan. 22, 2019

(54) DIGITAL LOW DROP-OUT (LDO) VOLTAGE REGULATOR WITH ANALOG-ASSISTED DYNAMIC REFERENCE CORRECTION

(71) Applicant: STMicroelectronics International N.V., Schiphol (NL)

(72) Inventors: Abhirup Lahiri, Delhi (IN); Nitin Bansal, Gurgaon (IN); Shrestha Bansal, Bareilly (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/848,130

(22) Filed: Dec. 20, 2017

(51) Int. Cl.
*G05F 1/565* (2006.01)
*H02M 3/158* (2006.01)
*G05F 1/575* (2006.01)
*H02M 3/157* (2006.01)
*H03F 3/45* (2006.01)
*H02M 1/00* (2006.01)

(52) U.S. Cl.
CPC .............. *G05F 1/565* (2013.01); *G05F 1/575* (2013.01); *H02M 3/157* (2013.01); *H02M 3/1584* (2013.01); *H03F 3/45179* (2013.01); *H02M 2001/007* (2013.01); *H02M 2001/0012* (2013.01)

(58) Field of Classification Search
CPC ...... H02M 3/135; H02M 3/145; H02M 3/155; H02M 3/156; H02M 3/157; H02M 3/158; G05F 1/56; G05F 1/565; G05F 1/575; G05F 1/465; G05F 1/468; G05F 3/30

USPC ....... 323/265, 273, 280, 281, 282, 283, 312, 323/313
See application file for complete search history.

(56) References Cited

U.S. PATENT DOCUMENTS

| | | | | |
|---|---|---|---|---|
| 4,578,715 A | * | 3/1986 | Yamaguchi | H03M 1/365 341/160 |
| 5,254,995 A | * | 10/1993 | Hantke | H03M 1/365 341/132 |
| 5,510,706 A | * | 4/1996 | Good | G01P 3/48 324/166 |
| 5,877,718 A | * | 3/1999 | Andoh | H03M 1/0682 341/155 |
| 6,885,236 B2 | * | 4/2005 | Vorenkamp | H03M 1/0602 327/540 |
| 2006/0119500 A1 | * | 6/2006 | Serrano | G11C 7/14 341/155 |

OTHER PUBLICATIONS

Okuma, Yasuyuki et al: "0.5-V Input Digital LDO with 98.7% Current Efficiency and 2.7-µA Quiescent Current in 65nm CMOS," 2010 IEEE, Custom Integrated Circuits Conference (CICC) (4 pages).

(Continued)

*Primary Examiner* — Adolf Berhane
(74) *Attorney, Agent, or Firm* — Crowe & Dunlevy

(57) ABSTRACT

A digital low drop-out regulator circuit includes transistor switches that are selectively actuated in response to a comparison of an output voltage at an output node to corresponding tap reference voltages. A dynamic reference voltage correction circuit operates to shift voltage levels of the tap reference voltages in response to a difference between the output voltage at the output node and an input reference voltage.

15 Claims, 4 Drawing Sheets

(56) References Cited

OTHER PUBLICATIONS

Lee, Yong-Jin et al: "A 200-mA Digital Low Drop-Out Regulator With Coarse-Fine Dual Loop in Mobile Application Processor," © 2016 IEEE, IEEE Journal of Solid-State Circuits, vol. 52, No. 1, Jan. 2017, pp. 64-76.

Kim, Doyun et al: "Fully Integrated Low-Drop-Out Regulator Based on Event-Driven PI Control," 2016 IEEE International Solid-State Circuits Conference, ISSCC 2016 / Session 8 / Low-Power Digital Circuits / 8.2 (3 pages).

Nasir, Saad Bin et al: "A Model Study of an All-Digital, Discrete-Time and Embedded Linear Regulator," arXiv preprint arXiv: 1501.00579 (2015) (5 pages).

Huang, Mo et al: "A Fully Integrated Digital LDO With Coarse-Fine-Tuning and Burst-Mode Operation," IEEE Transactions on Circuits and Systems II: Express Briefs, vol. 63, No. 7, Jul. 2016, pp. 683-687.

Nasir, Saad Bin et al: "A 0.13μm Fully Digital Low-Dropout Regulator with Adaptive Control and Reduced Dynamic Stability for Ultra-Wide Dynamic Range," 2015 IEEE International Solid-State Ciruicts Conference, ISSCC 2015 / Session 5 / Analog Techniques / 5.6 (3 pages).

Hazucha, Peter et al: "An Area-Efficient, Integrated, Linear Regulator With Ultra-Fast Load Regulation," 2004 Symposium on VLSI Circuits Digest of Technical Papers, 2004 IEEE (pp. 218-221).

Salem, Loai G. et al: "A 100nA-to-2mA Successive-Approximation Digital LDO with PD Compensation and Sub-LSB Duty Control Achieving a 15.1 ns Response Time at 0.5V," 2017 IEEE International Solid-State Circuits Conference, ISSCC 2017 / Session 20 / Digital Voltage Regulators and Low-Power Techniques / 20.3 (3 pages).

Huang, Mo et al: "An Output-Capacitor-Free Analog-Assisted Digital Low-Dropout Regulator with Tri-Loop Control," 2017 IEEE International Solid-State Circuits Conference, ISSCC 2017 / Session 20 / Digital Voltage Regulators and Low-Power Techniques / 20.4 (3 pages).

\* cited by examiner

DIGITAL LOW DROP-OUT (LDO) VOLTAGE REGULATOR WITH ANALOG-ASSISTED DYNAMIC REFERENCE CORRECTION

TECHNICAL FIELD

The present invention relates to a low drop-out (LDO) voltage regulator and, in particular, to a digital LDO voltage regulator.

BACKGROUND

FIG. 1 shows a circuit diagram for a conventional digital low drop-out (LDO) voltage regulator circuit 10. The circuit 10 includes an array 12 of transistor switches 14(1)-14(n), wherein each transistor switch 14 has a first conduction terminal (for example, a source terminal) connected to a supply voltage node Vdd and a second conduction terminal (for example, a drain terminal) connected to an output node Vout. A digital controller 16 generates a plurality of digital control signals 18(1)-18(n) that are applied to the control terminals (for example, a gate terminal) of the transistor switches 14(1)-14(n), respectively. The transistor switches 14(1)-14(n) comprise p-channel MOSFET devices. In response to assertion (for example, logic low) of a digital control signal 18, the corresponding transistor switch 14 is turned on to source current to the load 22 and to the output capacitor 24 to develop the regulated output voltage at the output node Vout. A comparator 28 has a first input that receives the regulated output voltage at the output node Vout and a second input that receives a reference voltage Vref. The comparator 28 compares Vout to Vref and generates a digital comparison signal 30 that is applied to an input of the digital controller 16. Depending on the logic state of the digital comparison signal 30, the digital controller 16 adjusts the number of digital control signals 18(1)-18(n) that are asserted. For example, if Vout exceeds Vref then there is a decrease in the number of digital control signals 18(1)-18(n) that are asserted and this accordingly decreases the number of transistor switches 14(1)-14(n) that are turned on. Conversely, if Vref exceeds Vout then there is an increase in the number of digital control signals 18(1)-18(n) that are asserted and this accordingly increases the number of transistor switches 14(1)-14(n) that are turned on.

In an example implementation, the digital controller 16 may be implemented as a multi-bit bidirectional shift register having a serial input configured to receive the digital comparison signal 30 and a parallel output configured to generate the digital control signals 18(1)-18(n). In response to a logic state of the comparison signal 30 indicating that Vout exceeds Vref, the multi-bit shift register will shift in a first direction which reduces the number of bits of the shift register that are at the logic low state. If the logic state of the comparison signal 30 instead indicates that Vref exceeds Vout, the multi-bit shift register will shift in a second direction which increases the number of bits of the shift register that are at the logic low state.

There are a number of advantages of digital LDO voltage regulators like that shown in FIG. 1; those advantages include: low supply voltage operation and scalability. However, there are drawbacks including: a trade-off between power and speed, a need for a large output capacitor 24, a large ripple on the regulator output voltage Vout and a reduced accuracy of the regulated output voltage. There is a need in the art to address at least some of the foregoing drawbacks while maintaining the advantages of the digital LDO solution.

SUMMARY

In an embodiment, a voltage regulator circuit comprises: a plurality of transistor switches connected in parallel with each other between a supply voltage node and an output node; a corresponding plurality of voltage comparator circuits, wherein an output of each voltage comparator circuit is connected to a control terminal of a corresponding transistor switch of the plurality of transistor switches, each voltage comparator having a first input coupled to receive an output voltage at the output node and a second input coupled to receive a corresponding tap reference voltage of a plurality of tap reference voltages; a resistive divider circuit configured to receive a divider current and generate from said divider current the plurality of tap reference voltages; and a voltage to current generator circuit configured to generate the divider current as a function of a difference between an input reference voltage and the output voltage at the output node.

In an embodiment, a voltage regulator circuit comprises: a digital low drop-out regulator circuit including a plurality of transistor switches selectively actuated in response to a comparison of an output voltage at an output node to a plurality of tap reference voltages; and a dynamic reference voltage correction circuit configured to shift voltage levels of the plurality of tap reference voltages in response to a difference between the output voltage at the output node and an input reference voltage.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings.

DETAILED DESCRIPTION

Figure 1:
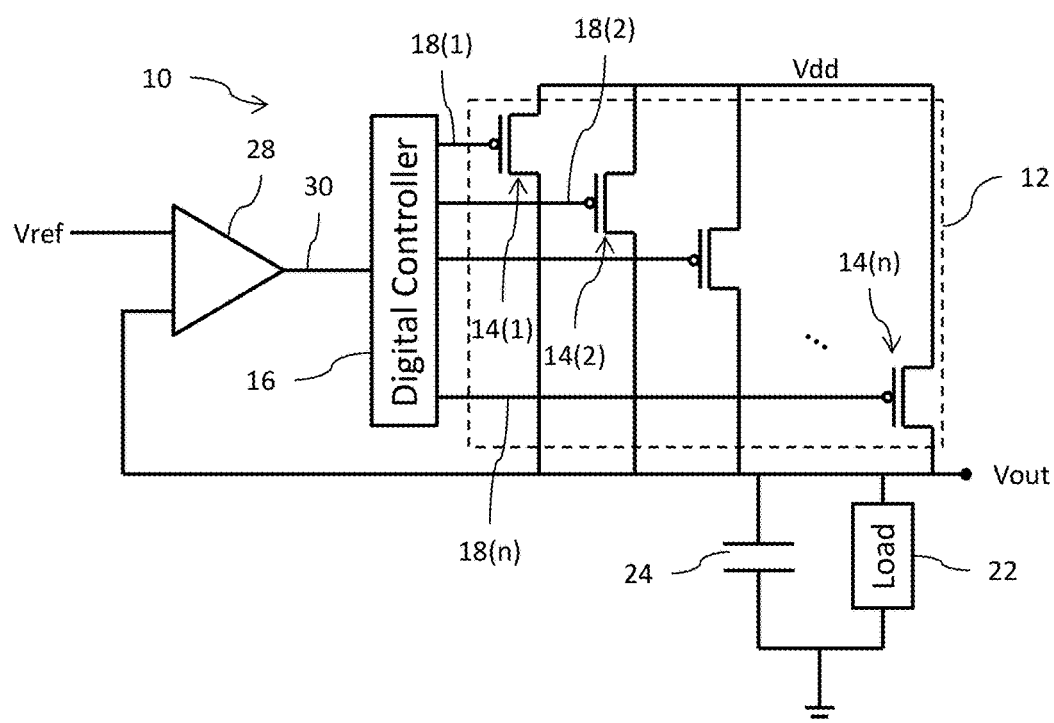
FIG. 1 is a circuit diagram for a conventional digital low drop-out (LDO) voltage regulator circuit.
Figure 2:
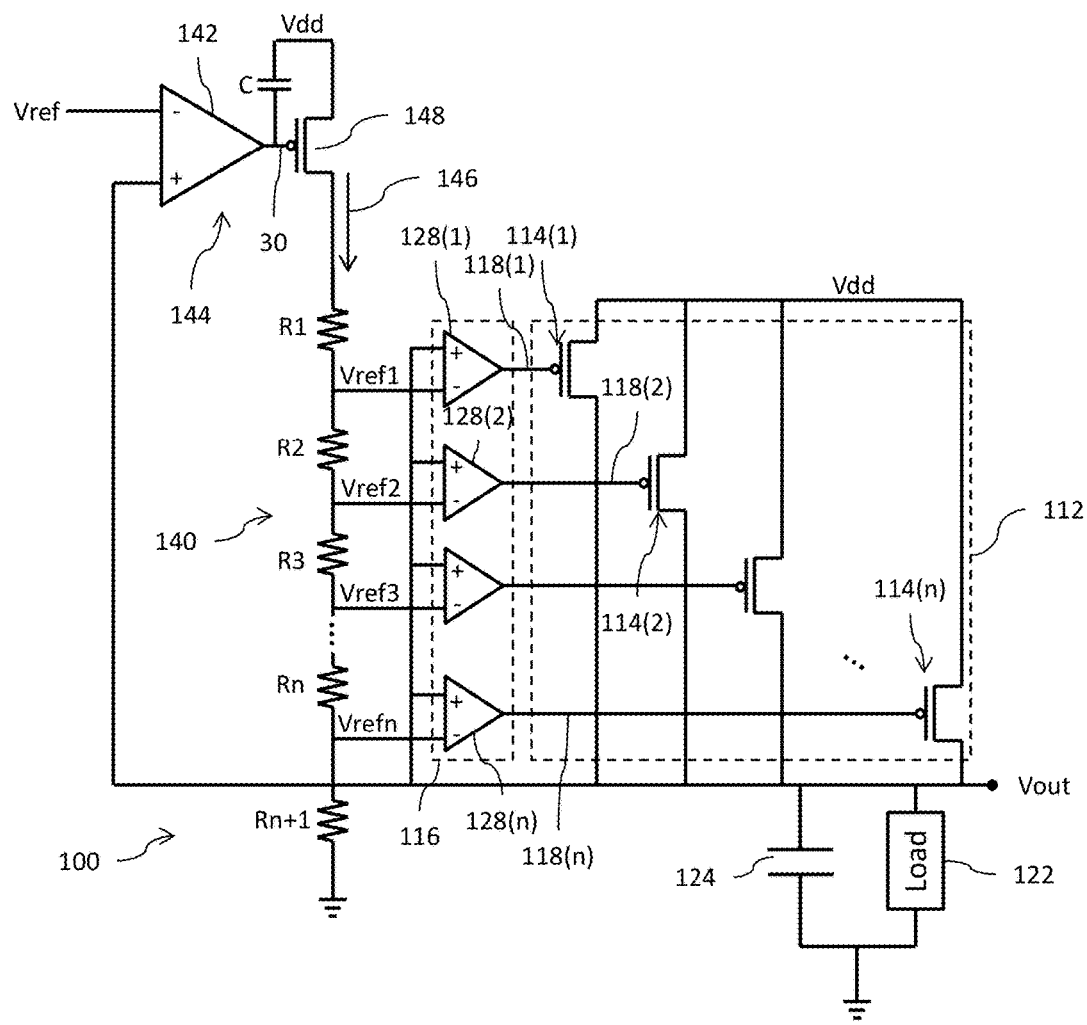
FIG. 2 is a circuit diagram for a digital LDO voltage regulator circuit.

Reference is now made to FIG. 2 which shows a circuit diagram for a digital low drop-out (LDO) voltage regulator circuit 100. The circuit 100 includes an array 112 of transistor switches 114(1)-114(n), wherein each transistor switch 114 has a first conduction terminal (for example, a source terminal) connected to a supply voltage node Vdd and a second conduction terminal (for example, a drain terminal) connected to an output node Vout. A digital controller 116 generates a plurality of digital control signals 118(1)-118(n) that are applied to the control terminals (for example, a gate terminal) of the transistor switches 114(1)-114(n), respectively. The transistor switches 114(1)-114(n) comprise p-channel MOSFET devices. In response to assertion (for example, logic low) of a digital control signal 118, the corresponding transistor switch 114 is turned on to source current to the load 122 and to the output capacitor 124 to develop the regulated output voltage at the output node Vout.

The digital controller 116 comprises a plurality of asynchronous comparators 128(1)-128(n) with hysteresis. Each comparator 128 with hysteresis has a first input that receives the regulated output voltage at the output node Vout. Each comparator of the plurality of comparators 128(1)-128(n) further has a second input that receives a corresponding one of a plurality of tap reference voltages Vref1-Vrefn. The control signals 118(1)-118(n) are generated by the comparators 128(1)-128(n) as a result of the comparison of the Vout voltage to the corresponding one of the plurality of tap reference voltages Vref1-Vrefn. If Vout exceeds the applied one of the tap reference voltages Vref1-Vrefn then the corresponding comparator 128 will deassert the digital control signal 118 and as a result the overall number of transistor switches 114 that are turned on decreases. Conversely, if the applied one of the tap reference voltages Vref1-Vrefn exceeds Vout then the corresponding comparator 128 will assert the digital control signal 118 and as a result the overall number of transistor switches 114 that are turned on increases.

The plurality of tap reference voltages Vref1-Vrefn are generated by a resistive voltage divider circuit 140 formed by the series connection of a plurality of resistors R1 to Rn+1. A different one of the plurality of tap reference voltages Vref1-Vrefn is generated at each tap node of the resistive voltage divider circuit 140.

A voltage to current generator circuit 144 generates a divider current 146 that is applied to the resistive voltage divider circuit 140. The magnitude of the divider current 146 output by the voltage to current generator circuit 144 is dependent on a difference between the Vout voltage and an input reference voltage Vref. A differential amplifier 142 configured as a transconductance amplifier has a non-inverting input configured to receive the Vout voltage and an inverting input configured to receive the input reference voltage Vref. The single-ended output of the differential amplifier 142 is connected to the gate terminal of a p-channel MOSFET device 148 whose source terminal is connected to the supply voltage node Vdd and whose drain terminal is connected to one end of resistive voltage divider circuit 140. An opposite end of the resistive voltage divider circuit 140 is connected to a ground reference node. A capacitor C is coupled between the supply voltage node Vdd and the gate terminal of a p-channel MOSFET device 148 to filter the voltage at the output of the differential amplifier 142. In an embodiment, the resistors R1 to Rn have a same resistance value so that the step change in the tap reference voltages Vref1-Vrefn is equal. The resistive voltage divider circuit 140 functions as a current to plural voltage converter to generate the tap reference voltages Vref1-Vrefn from the applied divider current.

It will be noted that operation of the circuit 100 utilizes two feedback loops. A first feedback loop is provided through the operation of the digital controller 116 whose plurality of comparators 128(1)-128(n) function to compare the output voltage Vout to each of the plurality of tap reference voltages Vref1-Vrefn in order to control actuation of the transistor switches 114(1)-114(n). This first feedback loop is part of a fast asynchronous comparator circuit that regulates the output voltage Vout with a reduced response time, faster switching and reduced output rippling. A second feedback loop is provided through the operation of the voltage to current generator circuit 144 which functions to generate the resistive voltage divider current 146 which is dependent on a difference between the output voltage and the input reference voltage Vref. This second feedback loop is part of an analog-assisted dynamic reference correction circuit that dynamically controls the magnitudes of the plurality of tap reference voltages Vref1-Vrefn to provide for improved DC load regulation.

Figure 3A:
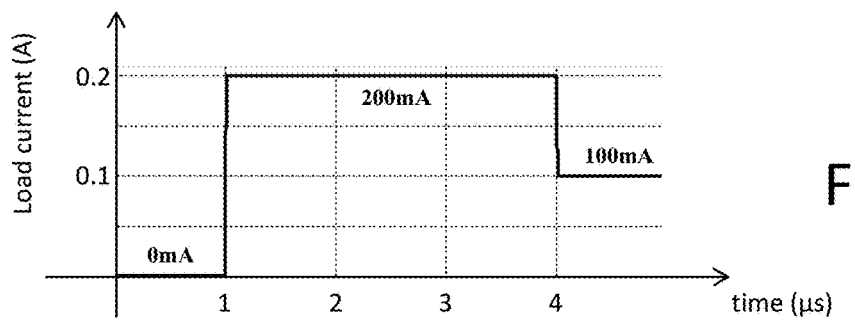
FIGS. 3A-3C and 4A-4B are waveform diagrams illustrating operation of the circuit of FIG. 2.
Figure 3B:
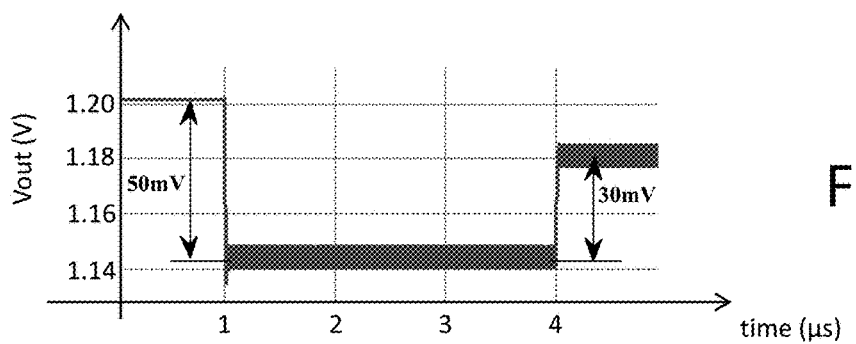
Figure 3C:
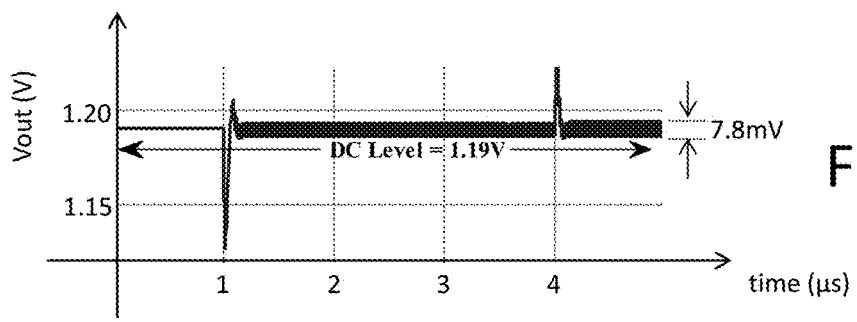

The benefit of including the second feedback loop to provide dynamic reference correction is illustrated by FIGS. 3A-3C. FIG. 3A is a waveform diagram illustrating change in load current as a function of time. In particular, load current changes from 0mA to 200 mA and then to 100 mA over time. FIG. 3B is a waveform diagram illustrating the voltage Vout in response to the change in load current of FIG. 3A using only the first feedback loop to provide regulation. It will be noted that the DC level of the regulated Vout voltage level is not constant, but rather is somewhat dependent on load current. The second feedback loop providing dynamic reference correction addresses the foregoing problem. FIG. 3C is a waveform diagram illustrating the voltage Vout in response to the change in load current of FIG. 3A using both the first and second feedback loops to provide regulation. It will be noted that the regulated Vout voltage level is constant at 1.19V notwithstanding change in load current over time.

Figure 4A:
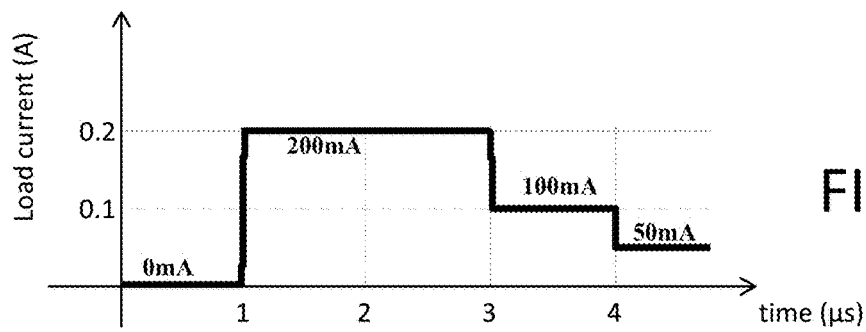
Figure 4B:
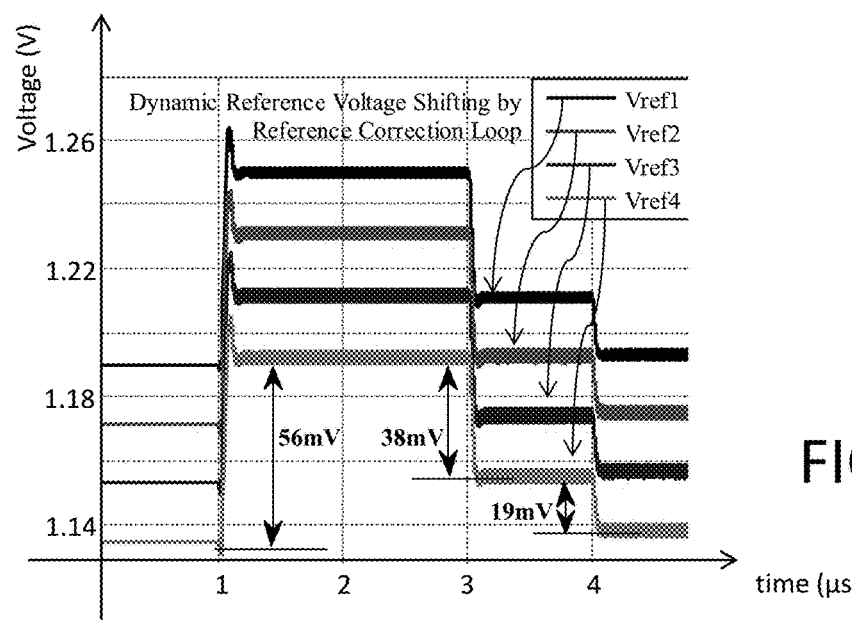

Reference is now made to FIGS. 4A-4B to illustrate the operation for dynamic reference correction. FIG. 4A is a waveform diagram illustrating change in load current as a function of time. In particular, load current changes from 0 mA to 200 mA and then to 100 mA and then to 50 mA over time. FIG. 4B is a waveform diagram illustrating a plurality of tap reference voltages Vref1-Vref4 in response to the change in load current of FIG. 4A. It will be noted that the second feedback loop to provide dynamic reference correction shifts the voltage levels of the plurality of tap reference voltages Vref1-Vrefn depending on change in output voltage level. The regulated output voltage is not only constant regardless of change in load current, but also exhibits a minimal output voltage ripple of, for example, 7.8 mV as shown in FIG. 3C.

The circuit 100 of FIG. 2 is operable with a supply voltage Vdd in the range of 0.9-1.3V and a regulated output voltage Vout in the range of 0.85-1.2V. With a maximum load current of 4 mA, the circuit 100 may use an output capacitor 124 with a capacitance of 100 pF and exhibit a current efficiency of 98.15%. With a maximum load current of 200 mA, the circuit 100 may use an output capacitor 124 with a capacitance of 5 nF and exhibit a current efficiency of 99.96%. In either case, the load regulation is 0.005 mV/mA. The quiescent current of the circuit 100 is 75 µA.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A voltage regulator circuit, comprising:
 a plurality of transistor switches connected in parallel with each other between a supply voltage node and an output node;
 a corresponding plurality of voltage comparator circuits, wherein an output of each voltage comparator circuit is connected to a control terminal of a corresponding transistor switch of the plurality of transistor switches, each voltage comparator having a first input coupled to receive an output voltage at the output node and a second input coupled to receive a corresponding tap reference voltage of a plurality of tap reference voltages;

a resistive divider circuit configured to receive a divider current and generate from said divider current the plurality of tap reference voltages; and a voltage to current generator circuit configured to generate the divider current as a function of a difference between an input reference voltage and the output voltage at the output node.

2. The circuit of claim 1, wherein the plurality of transistor switches comprise a plurality of p-channel MOSFET devices with source terminals coupled to the supply voltage node and drain terminals coupled to the output node.

3. The circuit of claim 1, wherein the voltage to current generator circuit comprises:

a differential amplifier having a first input configured to receive the input reference voltage and a second input configured to receive the output voltage at the output node; and a MOSFET device having a gate terminal controlled by an output of the differential amplifier and a conduction terminal generating the divider current.

4. The circuit of claim 3, wherein the voltage to current generator circuit further comprises a capacitor coupled between the supply voltage node and the gate terminal of the MOSFET device.

5. A voltage regulator circuit, comprising:

a digital low drop-out regulator circuit including a plurality of transistor switches configured to generate a regulated output voltage at an output node, said plurality of transistor switches being selectively actuated in response to a comparison of the regulated output voltage at the output node to a plurality of tap reference voltages; and a dynamic reference voltage correction circuit configured to shift voltage levels of the plurality of tap reference voltages in response to a difference between the regulated output voltage at the output node and an input reference voltage.

6. The circuit of claim 5, further comprising a resistive divider circuit configured to receive a divider current and generate from said divider current the plurality of tap reference voltages.

7. The circuit of claim 6, wherein the dynamic reference voltage correction circuit shifts a magnitude of the divider current in response to the difference between the regulated output voltage at the output node and the input reference voltage.

8. The circuit of claim 5, wherein the dynamic reference voltage correction circuit comprises:

a voltage to current generator circuit configured to generate a divider current as a function of the difference between the regulated output voltage at the output node and the input reference voltage; and a current to voltage converter circuit configured to generate the plurality of tap reference voltages in response to said divider current.

9. The circuit of claim 8, wherein the current to voltage converter circuit comprises a resistive divider circuit.

10. The circuit of claim 8, wherein the voltage to current generator circuit comprises:

a differential amplifier having a first input configured to receive the input reference voltage and a second input configured to receive the regulated output voltage at the output node; and a MOSFET device having a gate terminal controlled by an output of the differential amplifier and a conduction terminal generating the divider current.

11. The circuit of claim 10, wherein the voltage to current generator circuit further comprises a capacitor coupled between a supply voltage node and the gate terminal of the MOSFET device.

12. A voltage regulator circuit, comprising:

an output node configured to generate a regulated output voltage;

a voltage to current generator circuit configured to generate a current having a magnitude that is dependent on a difference between an input reference voltage and the regulated output voltage;

a plurality of transistor switches connected in parallel with each other between a supply voltage node and the output node;

a resistive divider circuit configured to receive the current and generate from said current a plurality of tap reference voltages; and a corresponding plurality of voltage comparator circuits, wherein an output of each voltage comparator circuit is connected to a control terminal of a corresponding transistor switch of the plurality of transistor switches, each voltage comparator having a first input coupled to receive the regulated output voltage and a second input coupled to receive a corresponding tap reference voltage of the plurality of tap reference voltages.

13. The circuit of claim 12, wherein the plurality of transistor switches comprise a plurality of p-channel MOSFET devices with source terminals coupled to the supply voltage node and drain terminals coupled to the output node.

14. The circuit of claim 12, wherein the voltage to current generator circuit comprises:

a differential amplifier having a first input configured to receive the input reference voltage and a second input configured to receive the regulated output voltage; and a MOSFET device having a gate terminal controlled by an output of the differential amplifier and a conduction terminal generating the divider current.

15. The circuit of claim 14, wherein the voltage to current generator circuit further comprises a capacitor coupled between the supply voltage node and the gate terminal of the MOSFET device.

* * * * *